(12) United States Patent
Nicholson et al.

(10) Patent No.: US 6,911,896 B2
(45) Date of Patent: Jun. 28, 2005

(54) ENHANCED LINEARITY, LOW SWITCHING PERTURBATION RESISTOR STRINGS

(75) Inventors: Richard Nicholson, Thruxton (GB); Simon Churchill, Whitchurch (GB); Srikanth Govindarajulu, Sunnyvale, CA (US)

(73) Assignee: Maxim Integrated Products, Inc., Sunnyvale, CA (US)

(*) Notice: Subject to any disclaimer, the term of this patent is extended or adjusted under 35 U.S.C. 154(b) by 0 days.

(21) Appl. No.: 10/403,945

(22) Filed: Mar. 31, 2003

(65) Prior Publication Data

US 2004/0189438 A1 Sep. 30, 2004

(51) Int. Cl.$^7$ ................................................ H01C 1/012
(52) U.S. Cl. .......................... 338/260; 338/320; 338/295
(58) Field of Search ................................. 338/260, 295, 338/320; 341/153, 154

(56) References Cited

U.S. PATENT DOCUMENTS

| | | | |
|---|---|---|---|
| 1,381,579 A | | 6/1921 | Minns |
| 4,228,418 A | | 10/1980 | Piedmont et al. |
| 5,268,558 A | * | 12/1993 | Youssef et al. ............ 219/209 |
| 5,379,190 A | | 1/1995 | Hanamura et al. |
| 5,396,245 A | | 3/1995 | Rempfer |
| 5,504,471 A | | 4/1996 | Lund |
| 5,554,986 A | * | 9/1996 | Neidorff ................... 341/145 |
| 5,568,146 A | | 10/1996 | Park |
| 5,604,501 A | | 2/1997 | McPartland |
| 5,661,450 A | | 8/1997 | Davidson |
| 5,703,588 A | | 12/1997 | Rivoir et al. |
| 5,969,657 A | | 10/1999 | Dempsey et al. |
| 6,008,719 A | | 12/1999 | Jolivet |
| 6,127,957 A | | 10/2000 | Fattaruso et al. |
| 6,236,301 B1 | | 5/2001 | Langford et al. |
| 6,246,352 B1 | * | 6/2001 | Fattaruso et al. ........... 341/156 |
| 6,307,495 B1 | | 10/2001 | Mahant-Shetti et al. |
| 6,346,901 B1 | * | 2/2002 | Aiura et al. ............... 341/153 |
| 6,507,272 B1 | | 1/2003 | Nicholson et al. |
| 6,552,519 B1 | * | 4/2003 | Nazarian ................... 323/354 |

FOREIGN PATENT DOCUMENTS

| | | | |
|---|---|---|---|
| DE | 3526461 A1 | | 1/1987 |
| GB | 2039154 | * | 7/1980 |
| GB | 2184893 A | | 7/1987 |

* cited by examiner

Primary Examiner—Karl D. Easthom
(74) Attorney, Agent, or Firm—Blakely, Sokoloff, Taylor & Zafman LLP

(57) ABSTRACT

A resistor string that may have two resistor matrices laid out back-to-back with selected or all nominally equipotential nodes of the two matrices being interconnected. In certain applications, the matrix may have switch connections at each node, with the second matrix being an inactive matrix that may have the same number or different number, typically fewer resistors than the first matrix. In another embodiment, separate matrices may be used, and the inactive matrix may be smaller and have fewer resistors of a lower value to minimize the effect of gradients across the substrate. Preferred matrices and node connection switch configurations, as well as various embodiments of these and other features of the invention are disclosed.

19 Claims, 7 Drawing Sheets

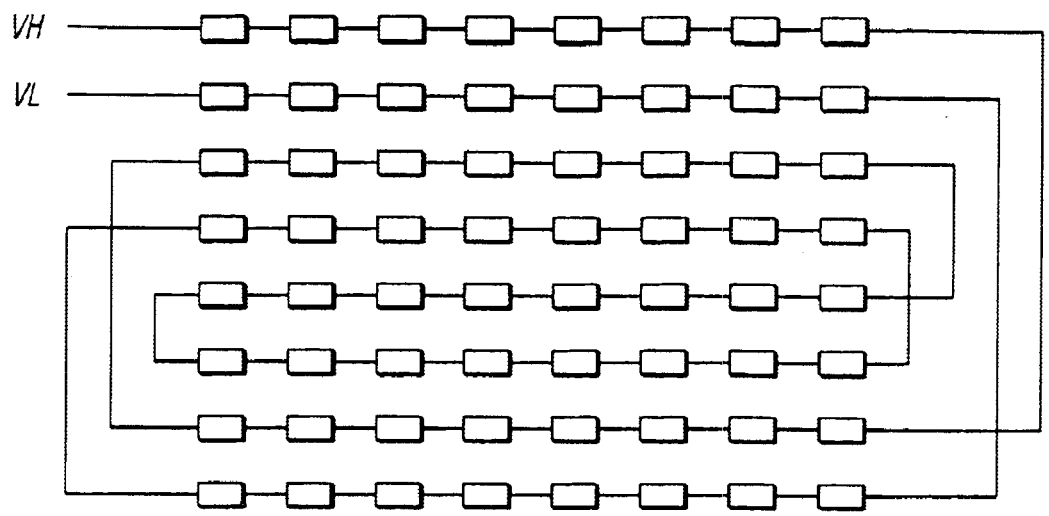
FIG. 1 *(Prior Art)*
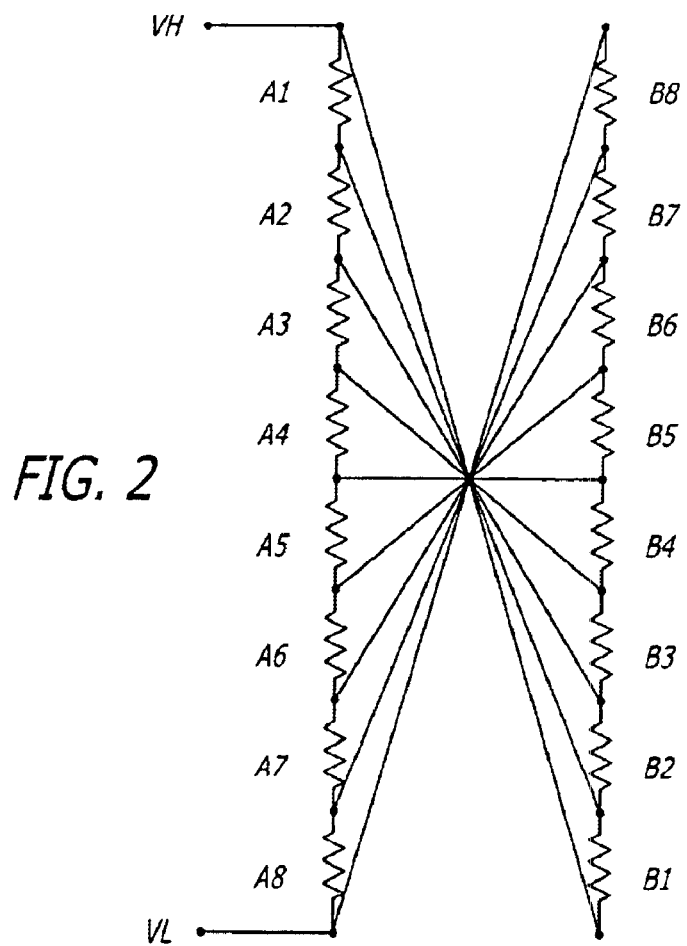
FIG. 2

US 6,911,896 B2

ENHANCED LINEARITY, LOW SWITCHING PERTURBATION RESISTOR STRINGS

BACKGROUND OF THE INVENTION

1. Field of the Invention

The present invention relates to the field of resistor strings and resistor string matrices.

2. Prior Art

The sources of Integral Non-Linearity (INL) and Differential Non-Linearity (DNL) in an integrated circuit resistor string can be generalized as the random mismatch between two adjacent resistors due to process imperfections, contact resistance, mask tolerances, diffraction effects, etc., and the macro-scale (i.e., greater than the dimensions of an individual resistor) resistivity gradients across the structure. To reduce such errors, techniques are known for laying out the resistor string in a manner to reduce the effect of the process variations. Such a prior art resistor string for reducing INL may be seen in FIG. 1.

Also known is a technique for switching between voltage taps so that charge on the various parasitic capacitances of the array cancel during a tap change, resulting in very low matrix perturbation (see U.S. Pat. No. 6,507,272). This technique is also used with the present invention.

BRIEF DESCRIPTION OF THE DRAWINGS

FIG. 1 illustrates a prior art resistor string.

FIG. 2 illustrates the electrical interconnection of resistive elements for M=1, N=8.

DETAILED DESCRIPTION OF THE PREFERRED EMBODIMENTS

In one aspect of the invention, two nominally identical resistor strings, each of N nominally identical elements and N+1 intermediate nodes (including end-points), such as each with the sequencing of FIG. 1, are connected back-to-back. These two strings are further interconnected every M number of intermediate nodes, where M can be any number from 1 (every node connected) to N (interconnected only at the end points). This connection is illustrated in FIG. 2 for M=1, N=8. This Figure illustrates the electrical interconnection of resistive elements, though not any particular physical layout of the array of resistive elements.

Figure 3:
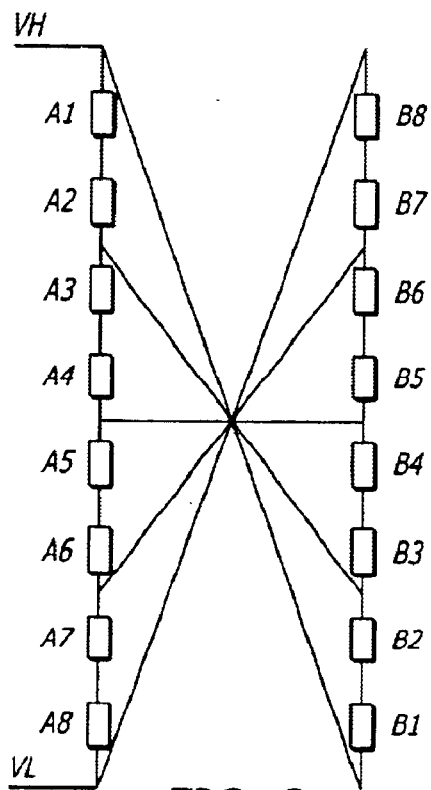
FIG. 3 illustrates the electrical interconnection of resistive elements for M=2, N=8.
Figure 4:
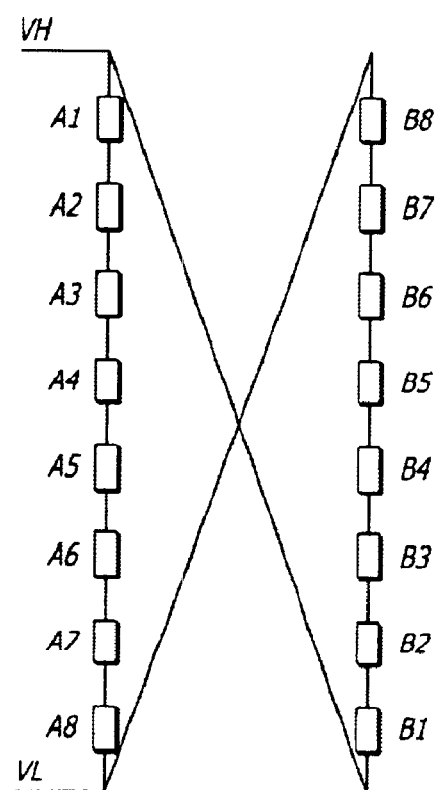
FIG. 4 illustrates the electrical interconnection of resistive elements for M=N=8.

An example with M=2, N=8 will only have every other node connected, as illustrated in FIG. 3 (i.e., top of element A1 to bottom of element B1, then top of element A3 to bottom of element B3, top of element A5 to bottom of element B5, and so on). With M=N=8, the top of A1 and the bottom of B1 will both be connected to VH, and the bottom of A8 and the top of B8 will both be connected to VL, with no further interaction between intermediate nodes, as shown in FIG. 4.

Figure 5:
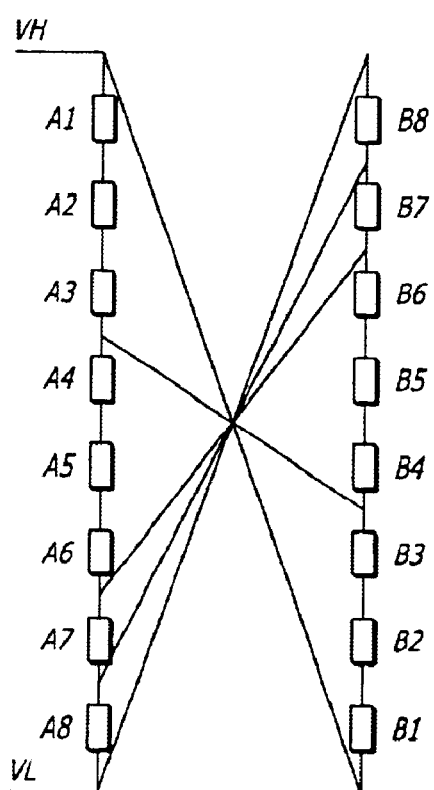
FIG. 5 illustrates the interconnection of unevenly spaced equipotential nodes.

It will be appreciated by one of ordinary skill in the art that it is not important that interconnected nodes are arranged such that they are equally spaced around the intermediate nodes, such as, by way of example, every 4th intermediate node. It is possible to connect any number of equipotential nodes. Referring to FIG. 5, it is valid to interconnect VH to the top of A1 to the bottom of B1, VL to the bottom of A8 and the top of B8, to connect the bottom of A7 to the top of B7, the bottom of A6 to the top of B6, and the bottom of A3 to the top of B3. In this example, all nodes interconnected are nominally equipotential nodes, but are not evenly spaced around the intermediate nodes. In this way, routing can be minimized and directed to target areas of the layout where gradient effects are known to be most acute. For the remainder of this disclosure, however, it will generally be assumed that there are equally spaced intermediate node string interconnections, though this is not a limitation of the invention.

Figure 6:
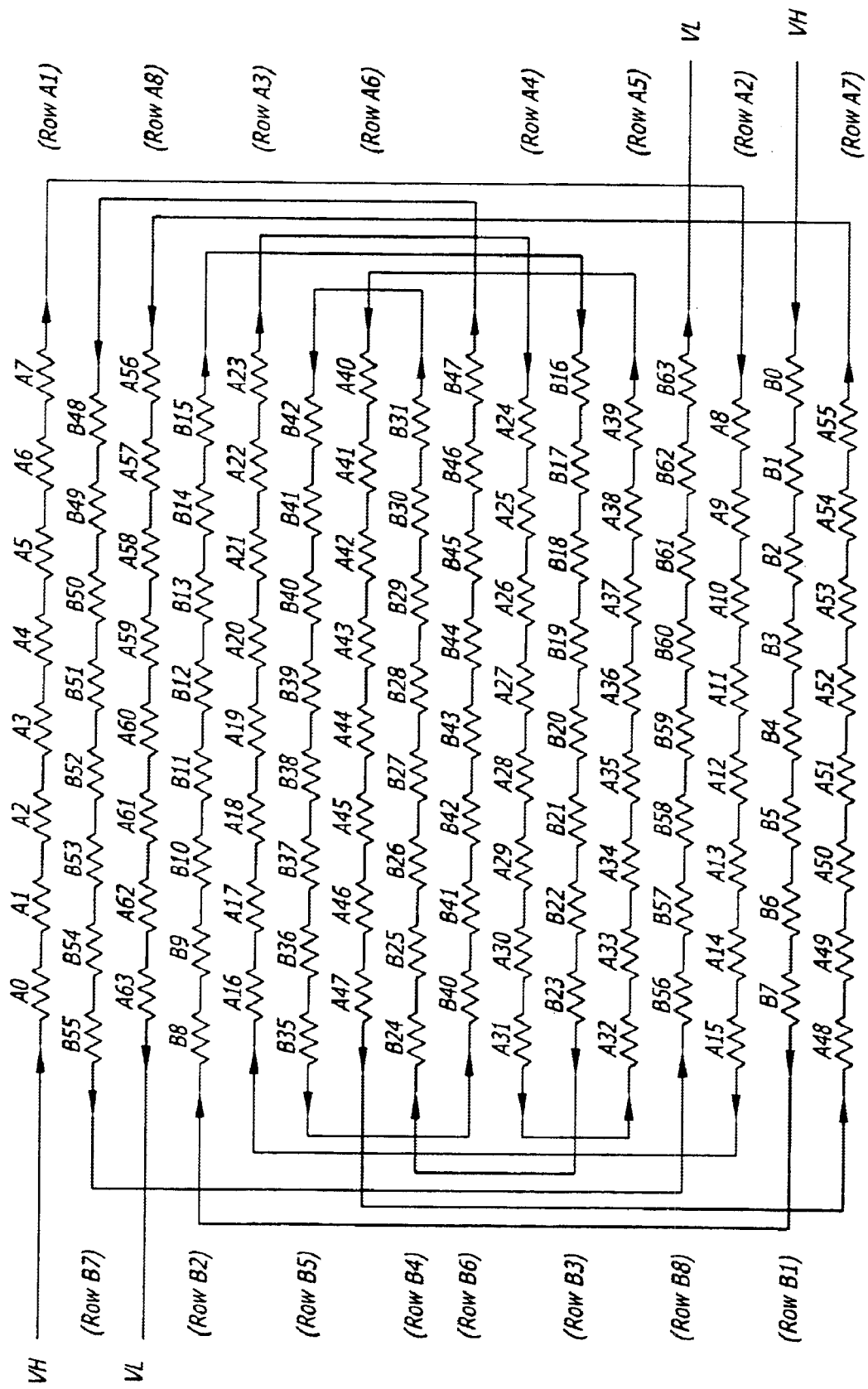
FIG. 6 illustrates a sequence of the two resistor strings for N=64, each in accordance with FIG. 1.

In the above arrangement, each resistor string is preferably, but not necessarily, arranged in the optimum sequencing of FIG. 1. A sequence of two resistor strings for N=64, each in accordance with FIG. 1, is shown in FIG. 6. The electrical interconnectivity between separate strings is not shown in this Figure for clarity in the layout of the resistive elements themselves.

In FIG. 6, the two resistor string networks could be interconnected at every node or at every 4th node or at every 8th node, etc. For example, resistor A0 could be connected to B0, A1 to B1, A2 to B2 or just A3 to B3, A7 to B7, A11 to B11 or just every 8th node A7 to B7, A15 to B15, A31 to B31, depending upon the linearity required. The more nodes connected, the more the routing overhead, so it can be difficult to achieve the ideal M=1 in practice. FIG. 6 depicts element layout position, without the interconnections between resistor strings drawn, whereas FIG. 2 shows all possible electrical interconnects with no layout implied.

Figure 7:
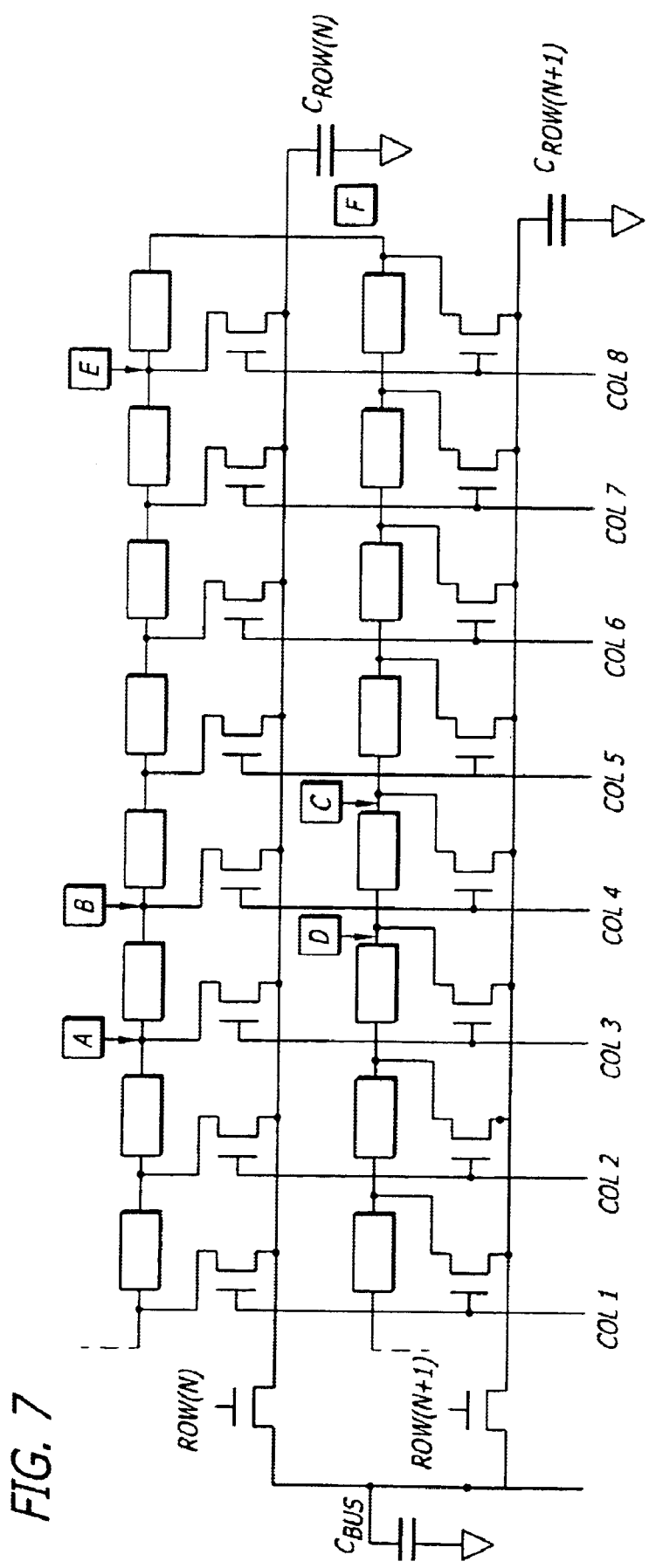
FIG. 7 shows two directly electrically connected (not necessarily physically adjacent) rows of a larger matrix, together with NMOS switches and the row/column decode lines.

The present invention may also use the switching scheme of U.S. Pat. No. 6,507,272 so that charge on the various parasitic capacitances of the array cancel during a tap change, resulting in very low matrix perturbation. Consider by way of example, FIG. 7. This Figure shows two directly electrically connected (not necessarily physically adjacent) rows of a larger matrix, together with NMOS switches and the row/column decode lines. The only requirement is that the rows alternate in direction from start to end of the resistor chain. Also shown on the diagram on FIG. 7 are the parasitic capacitors $C_{ROW(n)}$, $C_{ROW(n+1)}$ and $C_{BUS}$.

To select tap point A using n-channel transistors, COL3 and the gate of the ROW(n) select transistor are taken to a high potential, and the gates of all other ROW select transistors and COL lines are left at a low potential. Similarly, to select tap point C, COL4 and the gate of ROW(n+1) select transistor are taken to a high potential, and the gates of all other ROW select transistors and COL lines are left at a low potential.

Now consider what happens to the charges on the parasitic capacitors $C_{ROW(n)}$, $C_{ROW(n+1)}$ and $C_{BUS}$ when switching from tap A to tap B. Initially, COL3 and the gate of the ROW(n) select transistor are at a high potential. $C_{BUS}$ and $C_{ROW(n)}$ are both charged to the potential at tap A, $C_{ROW(n+1)}$ is charged to the potential at tap D. To move to tap B, COL3 is dropped to a low potential and COL4 is taken to a high potential. Now, $C_{ROW(n)}$ and $C_{BUS}$ must be discharged by one resistive element voltage drop. $C_{ROW(n+1)}$ must be charged by one resistive element voltage drop.

Looking at this another way, $C_{ROW(n)}$ tries to pull tap B up by one element voltage drop, whereas $C_{ROW(n+1)}$ tries to pull tap C down by one element voltage drop. As the resistance between node B and node C is low, relative to the total matrix resistance, the charge difference on $C_{ROW(n)}$ and $C_{ROW(n+1)}$ cancel with very little perturbation of the matrix node voltages. In that regard, note that the above argument applies to any two electrically adjacent rows. Consequently, while in FIG. 7, the resistors on the left of the two array rows appear to be electrically separated by almost two row widths of resistors, they are each directly connected to the left-most resistor of the next electrically adjacent row (electrically adjacent rows n−1 and n+2), so that the settling time for any tap change is always very short. Also on a tap change, the perturbation within a row is also quite low, as the maximum voltage change that a row can undergo is V/N, where V is the voltage differential applied across the resistor string and N is the number of rows in the string.

As all the rows in the matrix are in left/right pairs (direction of positive potential gradient), this cancellation happens across the entire matrix during a column change. Also, the tap change can be greater that one resistive element, for instance moving from tap A to tap E will also cause cancellation between the charge difference on $C_{ROW(n)}$ and $C_{ROW(n+1)}$.

When considering a row change, e.g., from tap B to tap C, it can be seen that the potentials on $C_{ROW(n)}$ and $C_{ROW(n+1)}$ do not change. The potential on $C_{BUS}$ must change by the difference in the potential at tap B and the potential at tap C. This is seen as matrix settling time and does not affect other nodes in the matrix significantly as $C_{BUS}$ will be much smaller than the sum of $C_{ROW1}+C_{ROW2}+\ldots+C_{ROWN}$.

When changing both row and column, a combination of the above arguments is applicable and charges cancel as described for a change from tap A to tap B. Therefore, when moving from any tap in the matrix to any other tap in the matrix, the charges on parasitic capacitors cancel through a relatively low resistance path, resulting in very low overall perturbation and fast settling of the matrix node voltages.

This new architecture as described above utilizes two back-to-back matrices, preferably each arranged with the sequencing of rows in accordance with FIG. 1. However only one resistor matrix needs to have the switches that provide access to the matrix voltages when it is used, for example in D/A conversion, hence resulting in an "active" string with output switches and an "inactive" string without output switches. This provides good immunity to both linear and non-linear wafer gradients. However, random mismatches between resistive elements also add to INL. Resistor matching could be improved by having large resistors, but for a matrix with resolution similar to 8-bits, having a large unit resistor would result in a very large area. When the area of the resistor matrix grows, wafer gradients become a major source of linearity error. Thus a minima results, because increasing resistor size to decrease random mismatch will increase matrix size, hence increasing INL due to gradient effects. In the present invention, once this minima is reached for a single matrix, by taking 2 such optimum matrices laid out anti-parallel (back-to-back) such that when the two matrices are interconnected as described above, gradients cancel almost 100% for M=1 (the advantage being somewhat reduced for higher values of M).

Figure 8:
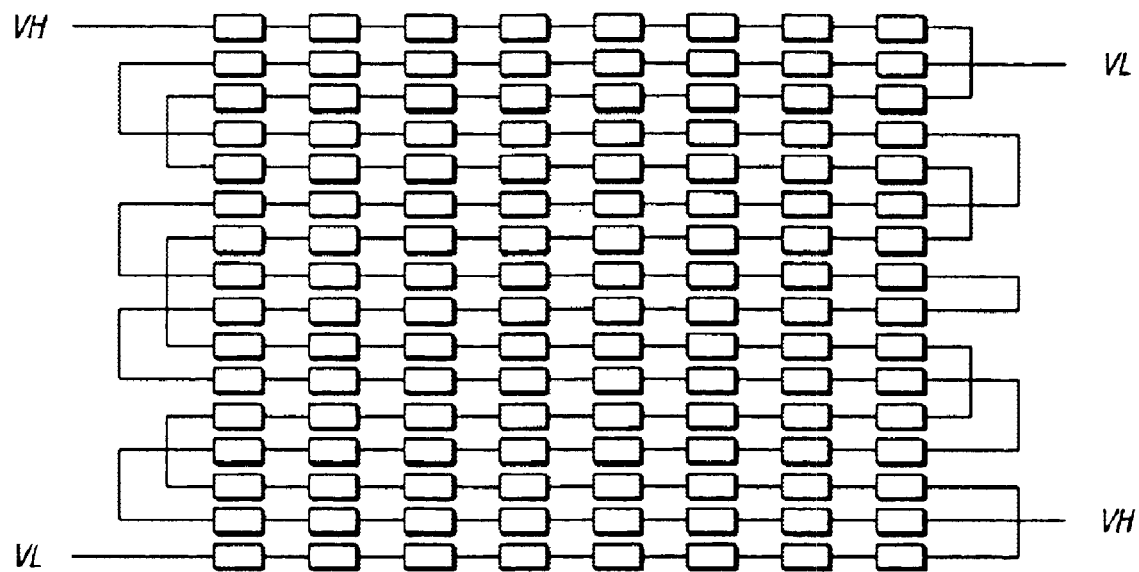
FIG. 8 illustrates the use of the present invention with a prior art snake resistor chain.

It is preferable, but not essential, to use the interleaving architecture of FIG. 6, as a simple "snake" architecture (a resistor string that is folded back and forth so that the physical order and the electrical order of the rows are the same) works equally well for linear gradients. The interleaving architecture has most benefit in its resilience to non-linear gradients, which a back-to-back snake arrangement would accentuate rather than suppress. Hence for the processing technologies of today, where gradients tend not to be linear, the present technique combined with the prior art layout is ideal, but particularly on an essentially linear gradient process, the simplified snake arrangement could be used with success (see FIG. 8).

Figure 9:
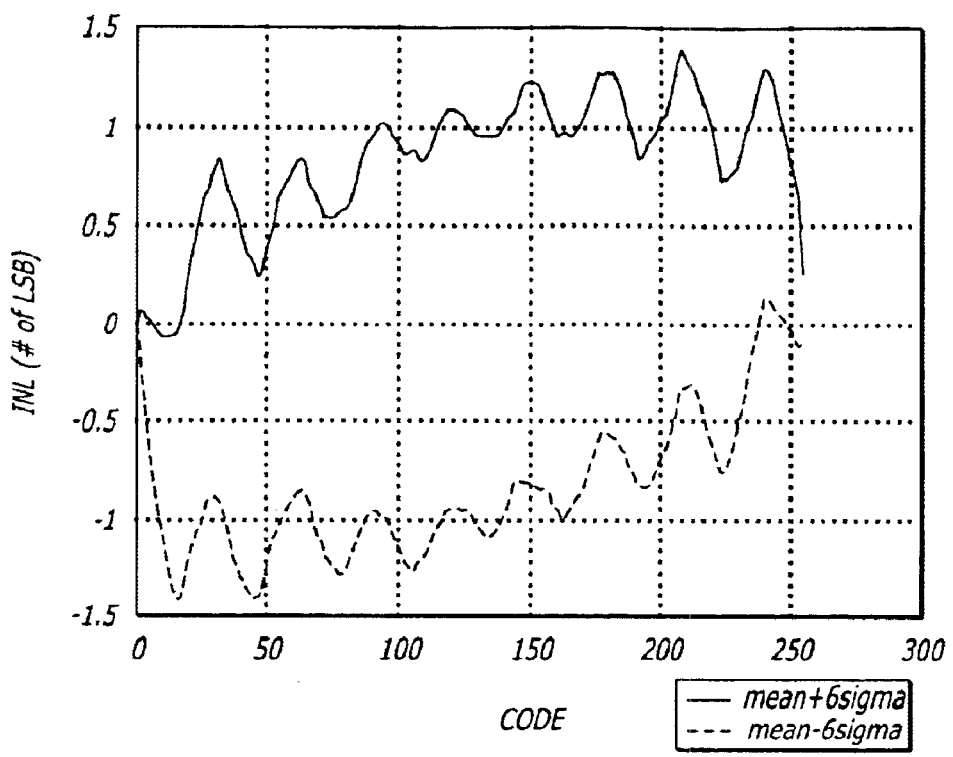
FIGS. 9, 10 and 11 show the 6-sigma linearity error for given element mismatch coefficients, X and Y gradient coefficients and a determined resistor spacing (i.e., a fixed layout) when this new architecture is implemented in a 16×16 (256 element) resistor matrix for three different numbers of resistors paralleled between the two matrices.
Figure 10:
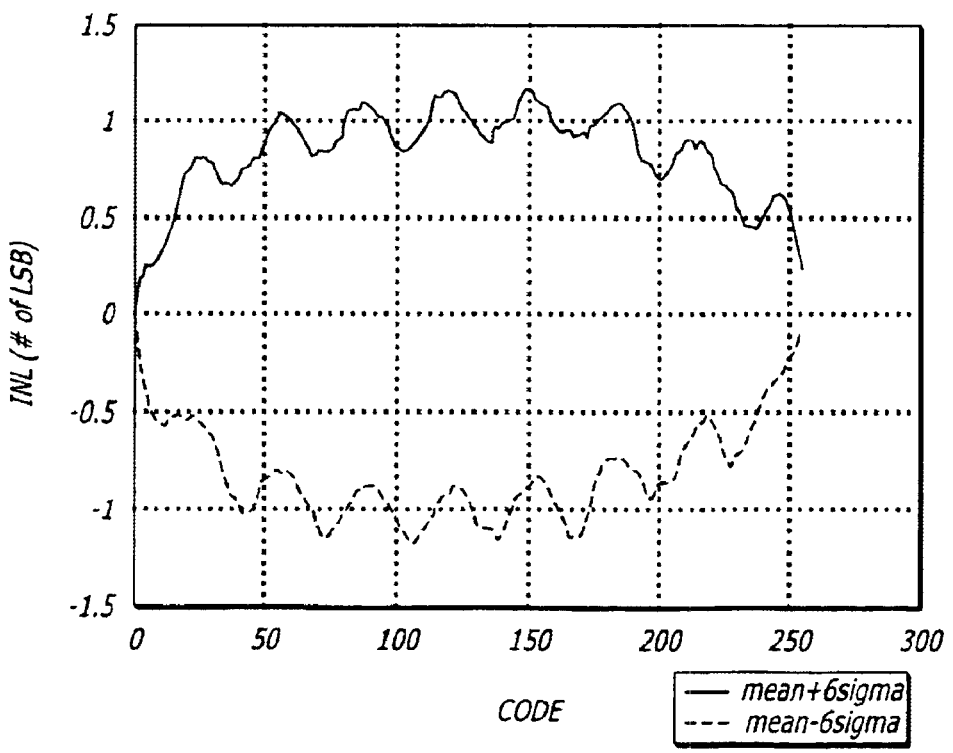
Figure 11:
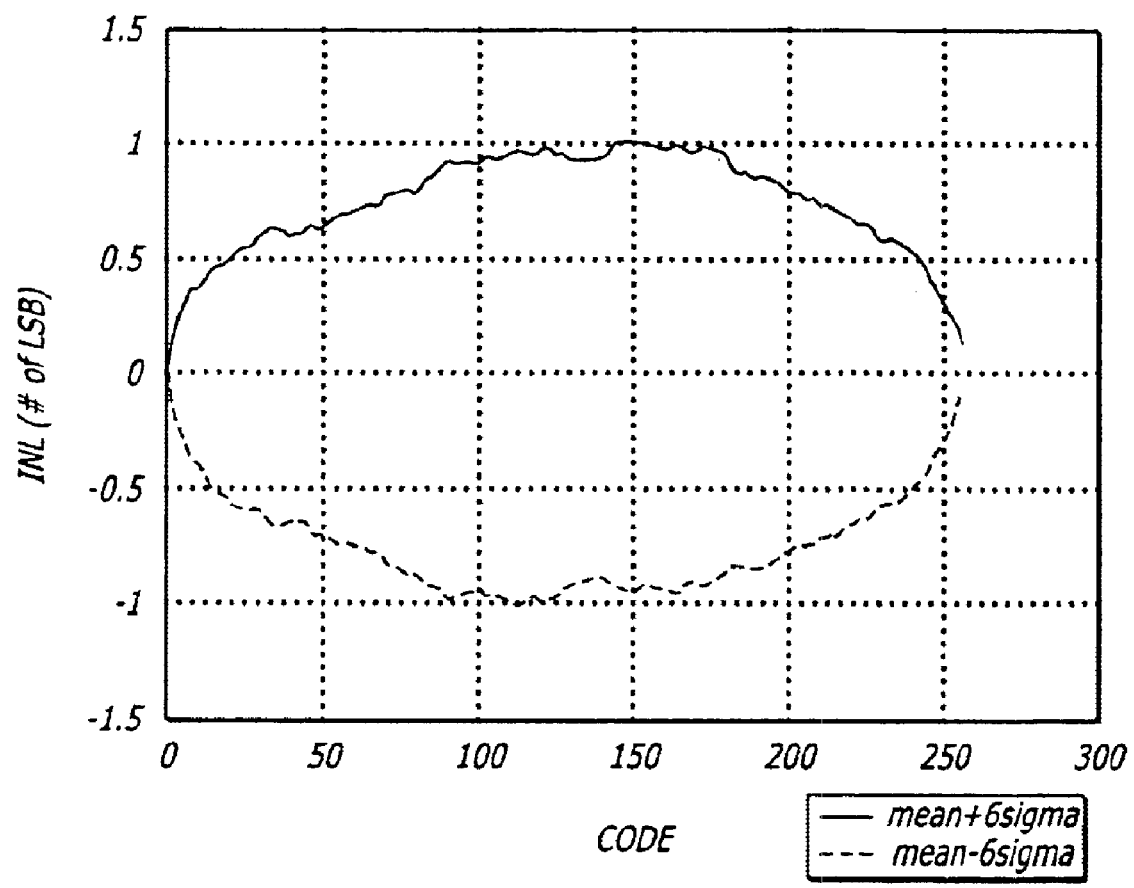

FIGS. 9, 10 and 11 show the 6-sigma linearity error for given element mismatch coefficients, X and Y gradient coefficients and a determined resistor spacing (i.e., a fixed layout) when this new architecture is implemented in a 16×16 (256 element) resistor matrix for three different numbers of resistors paralleled between the two matrices.

FIG. 9 shows the single matrix optimum (64 elements paralleled every 64th element, i.e., the parallel chain is not having any effect). This is the best that can be achieved with the prior art of FIG. 1. FIG. 10 shows the significant improvement over the data in FIG. 9 with only four interconnections between the two matrices. FIG. 11 shows the optimal linearity achieved for interconnections between the matrices at every point. The remaining error results from non-idealities in the layout (it is not possible to layout the devices with an exact common center for both resistor strings) and from random variations between resistor elements. It is possible that, given this result, a different resistor size/matrix size INL minima now exists, although in the interests of clarity of comparison this optimization has not been carried out for the results shown in FIGS. 9, 10 and 11. These Figures illustrate that the present invention achieves an untrimmed 6-sigma linearity error improvement of 30%, without further optimization to find the INL minima. Resistor random mismatches and a first order (linear) wafer gradient model have been used in the above simulations.

Figure 12:
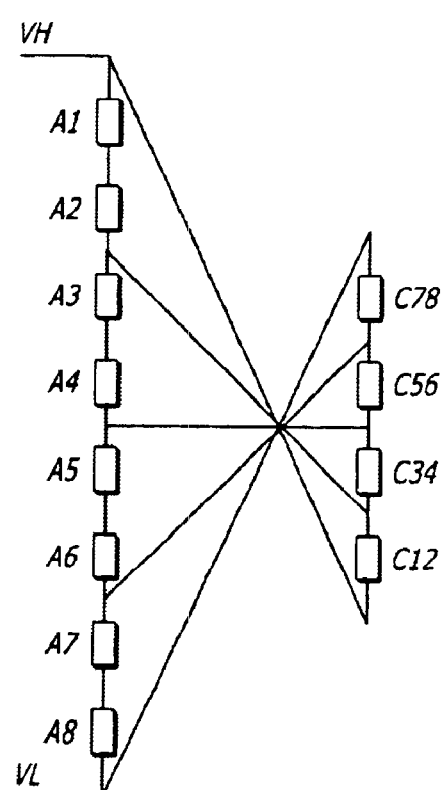
FIG. 12 is a schematic illustration of an active and an inactive resistor chain in accordance with the present invention wherein the inactive chain, having fewer elements and no access switches, could be made to occupy a much smaller area than the active chain, so that gradient effects on the whole matrix are much reduced.
Figure 13:
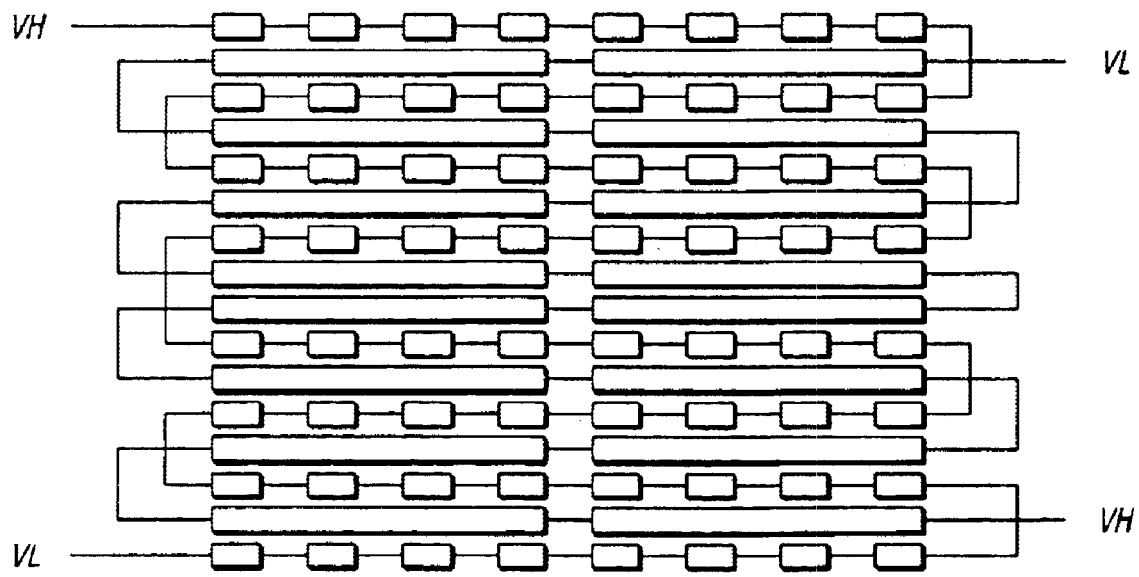
FIG. 13 illustrates combining resistors in the inactive resistor chain of a snake configuration in accordance with the present invention.

It will be recognized by those with ordinary skill in the art that for M>1, in still another aspect of the invention, resistive elements in the "inactive" string can be combined, possibly to good advantage. For instance, in the example of FIG. 3 with M=2, elements B1 and B2 can be combined into a single unit resistor C12 (see FIGS. 12 and 13) having a total resistance equal to the combined series resistance of B1 plus B2. Furthermore, it should be recognized that it is not a requirement of the invention that resistive elements in the active string are of nominally the same resistance as resistive elements in the inactive string. The only requirement is that interconnected nodes between the strings are at nominally the same potential. This flexibility can be used to achieve substantially the same result as the back-to-back dual matrix implementation described below in a condensed area, but with the penalty that direct compensation of wafer gradients is no longer assured. This can be compensated, however, by ensuring that the inactive chain dominates the active chain (by making the total series resistance of the inactive chain substantially smaller than the total resistance of the active chain). In this instance the inactive chain, with fewer elements and no access switches, could be made to occupy a much smaller area than the active chain, so that gradient effects on the whole matrix are much reduced. This is schematically illustrated in FIG. 12. The key penalty for this approach, therefore, is the reduced total resistance of the combined parallel combination of the active and inactive strings. In some cases, this may be acceptable, and the smaller area (compared to the full back-to-back architecture described) make an attractive solution.

While certain preferred embodiments of the present invention have been disclosed herein, such disclosure is only for purposes of understanding the exemplary embodiments and not by way of limitation of the invention. It will be obvious to those skilled in the art that various changes in form and detail may be made in the invention without departing from the spirit and scope of the invention as set out in the full scope of the following claims.

What is claimed is:

1. A resistor string comprising:
    a first matrix of N resistors connected in series;
    a second matrix of M resistors connected in series;
    a first lead connected to a first end of the first matrix and to a first end of the second matrix;
    a second lead connected to a second end of the first matrix and to a second end of the second matrix;
    each matrix comprises a matrix having an even number of rows and a plurality of columns of resistors, the resistors in each matrix being electrically connected in an order, any two successively connected rows of resistors in a matrix having resistors that are ordered in opposite directions across the matrix when traced from the first lead to the second lead, the first and second matrices having the same number of rows of resistors, the rows of the first and second matrices being physically interleaved;
    for each matrix, given a physical order of rows of 1, 2, . . . N, the first half and the second half of the electrical order of physical rows alternates between rows above and rows below the physical middle of the matrix;
    a plurality of nodes between resistors in the first matrix being connected, each to a nominally equipotential node between resistors in the second matrix.

2. The resistor string of claim 1 wherein the row of resistors immediately above the physical middle of the resistor string and the row of resistors immediately below the physical middle of the resistor string are rows of resistors of the same resistor matrix.

3. The resistor string of claim 2 wherein the number of rows of resistors in each resistor string is 8, and wherein the electrical order of the rows is physical row 1, physical row 7, physical row 3, physical row 5, physical row 6, physical row 4, physical row 8, physical row 2.

4. The resistor string of claim 3 further comprising a plurality of node select transistors, each having a control terminal controlling the conduction through the respective node select transistor between first and second transistor terminals, each node select transistor having its first terminal coupled to a respective node along the series connection of resistors of the first matrix, the control terminal of the node select transistors in each column being coupled to a respective column select line, and the second terminal of each node select transistor in each row of the array being coupled to a respective row line.

5. The resistor string of claim 4 further comprised of a row select transistor coupled to each row line.

6. The resistor string of claim 5 wherein the current flow in each row of the first matrix, starting from the first lead, is in a different direction across the matrix than the current flow in the respective row of the second matrix, starting from the first lead.

7. A resistor string comprising:
    a first matrix of N resistors connected in series;
    a second matrix of M resistors connected in series;
    a first lead connected to a first end of the first matrix and to a first end of the second matrix;
    a second lead connected to a second end of the first matrix and to a second end of the second matrix;
    each matrix comprises a matrix having the same even member of rows and a plurality of columns of resistors, the resistors in each matrix being electrically connected in an order, any two successively connected rows of resistors in a matrix having resistors that are ordered in opposite directions across the matrix when traced from the first lead to the second lead, the rows of the second matrix when traced from the first lead to the second lead being interconnected in the same order as the rows of the second matrix when traced from the first lead to the second lead, the matrices being physically oriented so that the current flow in each row of the first matrix, starting from the first lead, is in a different direction across the matrix than the current flow in the respective row of the second matrix, starting from the first lead, the rows of the first and second matrices being physically interleaved, a plurality of nodes between resistors in the first matrix being connected, each to a nominally equipotential node between resistors in the second matrix.

8. The resistor string of claim 7 wherein the row of resistors immediately above the physical middle of the resistor string and the row of resistors immediately below the physical middle of the resistor string are rows of resistors of the same resistor matrix.

9. The resistor string of claim 8 wherein the number of rows of resistors in each resistor string is 8, and wherein the electrical order of the rows is physical row 1, physical row 7, physical row 3, physical row 5, physical row 6, physical row 4, physical row 8, physical row 2.

10. The resistor string claim 9 further comprising a plurality of node select transistors, each having a control terminal controlling the conduction through the respective node select transistor between first and second transistor terminals, each node select transistor having its first terminal coupled to a respective node along the series connection of resistors in the first matrix, the control terminal of the node select transistors in each column being coupled to a respective column select line, and the second terminal of each node select transistor in each row of the array being coupled to a respective row line.

11. The resistor string of claim 10 further comprised of a row select transistor coupled to each row line.

12. The resistor string of claim 11 wherein M=N.

13. A resistor string comprising:
    a first matrix of N resistors connected in series, the first matrix having a plurality of rows and columns of resistors;
    a second matrix of M resistors connected in series, the second matrix having a plurality of rows and columns of resistors;

the first and second matrices having the same number of rows of resistors, the rows of the first and second matrices being physically interleaved, the resistors in each matrix being electrically connected in an order, any two successively connected rows of resistors in a matrix having resistors that are ordered in opposite directions across the matrix when traced from the first lead to the second lead;

a first lead connected to a first end of the first matrix and to a first end of the second matrix;

a second lead connected to a second end of the first matrix and to a second end of the second matrix;

the current flow in each row of the first matrix, starting from the first lead, is in a different direction across the matrix than the current flow in the respective row of the second matrix, starting from the first lead;

a plurality of nodes between resistors in the first matrix being connected to nominally equipotential nodes between resistors in the second matrix.

14. The resistor string of claim 13 wherein there is an even number of rows of resistors in each matrix.

15. The resistor string of claim 13 wherein for each matrix, given a physical order of rows of 1, 2, . . . N numbering from the first lead, the first half and the second half of the electrical order of physical rows each alternate between rows above and rows below the physical middle of the matrix.

16. The resistor string of claim 15 wherein the row of resistors immediately above the physical middle of the resistor string and the row of resistors immediately below the physical middle of the resistor string are rows of resistors of the same resistor matrix.

17. The resistor string of claim 16 wherein the number of rows of resistors in each resistor string is 8, and wherein the electrical order of the rows is physical row 1, physical row 7, physical row 3, physical row 5, physical row 6, physical row 4, physical row 8, physical row 2.

18. The resistor string of claim 13 wherein the number of rows in each matrix is an even number, and further comprising a plurality of node select transistors, each having a control terminal controlling the conduction through the respective node select transistor between first and second transistor terminals, each node select transistor having its first terminal coupled to a respective node along the series connection of resistors in the first matrix, the control terminal of the node select transistors in each column being coupled to a respective column select line, and the second terminal of each node select transistor in each row of the array being coupled to a respective row line.

19. The resistor string of claim 18 further comprised of a row select transistor coupled to each row line.

* * * * *